United States Patent
Joos

(10) Patent No.: US 11,290,041 B2
(45) Date of Patent: Mar. 29, 2022

(54) METHOD FOR CONTROLLING A SEMICONDUCTOR BRIDGE OF AN ELECTRICALLY OPERABLE MOTOR BY MEANS OF A RAMP SIGNAL, CONTROL DEVICE AND ARRANGEMENT

(71) Applicant: Conti Temic Microelectronic GmbH, Nuremberg (DE)

(72) Inventor: Uli Joos, Munich (DE)

(73) Assignee: Conti Temic Microelectronic GmbH

( * ) Notice: Subject to any disclaimer, the term of this patent is extended or adjusted under 35 U.S.C. 154(b) by 86 days.

(21) Appl. No.: 16/754,605

(22) PCT Filed: Oct. 1, 2018

(86) PCT No.: PCT/EP2018/076628
§ 371 (c)(1),
(2) Date: Apr. 8, 2020

(87) PCT Pub. No.: WO2019/072610
PCT Pub. Date: Apr. 18, 2019

(65) Prior Publication Data
US 2020/0266737 A1 Aug. 20, 2020

(30) Foreign Application Priority Data

Oct. 13, 2017 (DE) .................. 10 2017 218 305 .5

(51) Int. Cl.
*H03K 17/06* (2006.01)
*H03K 17/0812* (2006.01)
(Continued)

(52) U.S. Cl.
CPC ............ *H02P 7/04* (2016.02); *H03K 17/063* (2013.01); *H03K 17/163* (2013.01); *H03K 17/6871* (2013.01)

(58) Field of Classification Search
None
See application file for complete search history.

(56) References Cited

U.S. PATENT DOCUMENTS 5,099,138 A * 3/1992 Fukunaga .............. H02M 1/38
326/21
5,397,967 A 3/1995 Carobolante et al.
(Continued)

FOREIGN PATENT DOCUMENTS

ER 1986322 A1 10/2008
WO 2012007558 A1 1/2012

OTHER PUBLICATIONS

International Search Report and Written Opinion for International Application No. PCT/EP2018/076628, dated Dec. 10, 2018, 9 pages.

(Continued)

*Primary Examiner* — Kenneth B Wells
(74) *Attorney, Agent, or Firm* — RatnerPrestia

(57) ABSTRACT

A method for controlling a semiconductor bridge of an electrically operable motor, the semiconductor bridge being controlled depending on a pulse width modulation signal by a first controllable semiconductor switch and a separate second controllable semiconductor switch for supplying the electrically operable motor with electrical energy, a ramp signal with a predeterminable ramp slope for controlling one of the two controllable semiconductor switches being generated by a ramp generator, depending on the pulse width modulation signal. The invention also relates to a control device and to an arrangement.

13 Claims, 3 Drawing Sheets

(51) Int. Cl.
*H03K 17/16* (2006.01)
*H02M 1/00* (2006.01)
*H02M 7/538* (2007.01)
*H02P 7/03* (2016.01)
*H03K 17/687* (2006.01)

(56) References Cited

U.S. PATENT DOCUMENTS

| | | |
|---|---|---|
| 6,222,751 B1 | 4/2001 | Portaluri et al. |
| 6,281,730 B1 | 8/2001 | Vu |
| 7,187,197 B2 | 3/2007 | Tripathi et al. |
| 7,928,774 B2 | 4/2011 | Zannoth et al. |
| 8,390,341 B2 * | 3/2013 | Sugie .............. H03K 17/687 |
| | | 327/112 |
| 8,587,269 B2 | 11/2013 | Salato |
| 8,625,314 B2 | 1/2014 | Hosotani et al. |
| 9,312,852 B2 | 4/2016 | De Geeter et al. |
| 9,520,870 B2 | 12/2016 | Fugere et al. |
| 9,537,383 B1 | 1/2017 | Wibben |
| 9,614,444 B2 | 4/2017 | Babazadeh et al. |
| 10,833,669 B2 * | 11/2020 | Hiyama ................ H03K 17/163 |
| 2008/0266016 A1 | 10/2008 | Uhl et al. |
| 2009/0256617 A1 * | 10/2009 | Ochi .................. H03K 17/6874 |
| | | 327/333 |
| 2015/0028840 A1 | 1/2015 | Pasqualetto |
| 2015/0188532 A1 * | 7/2015 | Lenz ................ H03K 17/04123 |
| | | 327/109 |
| 2016/0160130 A1 | 6/2016 | Martin |
| 2017/0187284 A1 | 6/2017 | Vaidya et al. |

OTHER PUBLICATIONS

German Examination Report for German Application No. 10 2017 218 305.5, with partial translation, dated Aug. 22, 2018, 8 pages.

"Spannungsfolger", Wikipedia, with English translation, retrieved from the internet Mar. 13, 2020, 2 pages.

International Search Report and Written Opinion for International Application No. PCT/EP2018/076628, dated Dec. 10, 2018, 14 pages.

* cited by examiner

METHOD FOR CONTROLLING A SEMICONDUCTOR BRIDGE OF AN ELECTRICALLY OPERABLE MOTOR BY MEANS OF A RAMP SIGNAL, CONTROL DEVICE AND ARRANGEMENT

CROSS REFERENCE TO RELATED APPLICATIONS

This application is the U.S. National Phase Application of PCT International Application No. PCT/EP2018/076628, filed Oct. 1, 2018, which claims priority to German Patent Application No. 10 2017 218 305.5, filed Oct. 13, 2017, the contents of such applications being incorporated by reference herein.

FIELD OF THE INVENTION

The invention relates to a method for controlling a semiconductor bridge of an electrically operable motor, the semiconductor bridge being controlled depending on a pulse width modulation signal by a first controllable semiconductor switch and a separate second controllable semiconductor switch for supplying the electrically operable motor with electrical energy. The motor may in particular be an electrically operable motor for use in a motor vehicle, which is used for example as an adjusting motor in a window lifter mechanism, for a door release or a seat adjustment mechanism. The invention also relates to a control device and an arrangement.

BACKGROUND OF THE INVENTION

DC motors, which are used for example in motor vehicles, are usually controlled by means of relays or semiconductors. If variable control of the electrically operable motor is required, the semiconductors, which may for example be a MOSFET or an IGBT, are controlled by means of pulse width modulation. The switches are in this case switched on or off periodically to achieve the required power. The switching process is in this case dependent in particular on the parameters of the semiconductor and the arrangement, as a result of which tolerances in the switching time or switching slope must be taken into account, in particular if the control current is kept low in order to achieve high electromagnetic compatibility for the switching speed. A result of this is that the degree of sampling of the pulse width modulation control changes significantly, and in particular a short-circuit detection and protective devices for the switches can only react late to a short circuit. This means that the switches do not operate reliably.

EP 1986322 B1, incorporated herein by reference, also discloses an output stage for pulse-width-modulated activation of an electrical load. The output stage comprises a first input for inputting a first pulse width modulation signal, a power semiconductor switch for activating the electrical load in accordance with the duty cycle of the first pulse width modulation signal, and a delay circuit for generating a second pulse width modulation signal that is delayed compared to the first pulse width modulation signal, and a signal output for outputting the second pulse width modulation signal. The delay circuit comprises a first detector circuit, which determines the period of the first pulse width modulation signal and generates the second pulse width modulation signal such that it is delayed by a fraction of the determined period duration determined by a control signal compared to the first pulse width modulation signal. The disadvantage of such as pulse-to-pulse modulation is that the regulating device must be very complex and that after each start-up of the regulator a corresponding run-up time is required, which means that there is a period in which the switching is not reliably provided.

SUMMARY OF THE INVENTION

An aspect of the present invention is a method, a control device and an arrangement by means of which a switching speed of the semiconductor bridge is independent of the MOSFETs used and has improved electromagnetic compatibility.

One aspect of the invention relates to a method for controlling a semiconductor bridge of an electrically operable motor, the semiconductor bridge being controlled depending on a pulse width modulation signal by a first controllable semiconductor switch and a separate second controllable semiconductor switch for supplying the electrically operable motor with electrical energy. Depending on the pulse width modulation signal, a ramp signal with a predeterminable ramp slope for controlling one of the two controllable semiconductor switches is generated by means of a ramp generator.

As a result, the gate of the MOSFET can be activated independently of the type of parameter values of the MOSFET, so that the switching speed of the semiconductor bridge can be controlled independently of the MOSFETs used. Furthermore, the switching of the semiconductor bridge can be carried out with improved electromagnetic compatibility as a result of the predeterminable controlled ramp slope. Furthermore, the gate runtime can be shortened and stabilized by means of the method, in particular under operating conditions. An improved duty cycle of the pulse width modulation signal can also be realized from the shortened and stable gate delay. This also allows improved monitoring as to whether the respective semiconductor switch has switched or not to be carried out. Furthermore, the precontrol can be used to make the switching of the semiconductor bridge insensitive to interference at the electrical outputs without feedback.

The electrically operable motor is in particular an electrically operable motor of a motor vehicle. For example, the electrically operable motor can be an adjustment motor in the motor vehicle. A window lifter motor or a door release motor or a seat adjustment motor can be mentioned as an example of the electrically operable motor. In particular, such an adjustment motor requires a variable control, so that different powers can be transmitted to the adjustment motor. Different settings of the electric motor can thus be realized. The semiconductor bridge thus controls in particular the electrical energy as the supply voltage for the electrically operable motor, in particular for the adjustment motor in the motor vehicle. The electrically operable motor is in particular an electrically operable motor which can be operated by means of a direct current.

In the following explanations, it is assumed that the controllable semiconductor switches are closing switches, so that, if the gates are not supplied, the controllable semiconductor switches are open and are therefore non-conductive.

It is likewise possible that the controllable semiconductor switches are designed as make contacts, as a result of which the method explained below changes only on the basis of the corresponding parameter values of the controls.

According to an advantageous embodiment, the ramp signal for a predetermined opening value can represent an opening signal for the first controllable semiconductor switch and a closing signal for the second controllable semiconductor switch when the first controllable semiconductor switch is open. In particular, it may be provided that the opening value is for example 0 volts, so that, when the ramp signal reaches 0 volts, the first controllable semiconductor switch is opened. In particular, only when the first controllable semiconductor switch is open is the second controllable semiconductor switch closed. This can prevent a short circuit in the semiconductor bridge.

It has also proven to be advantageous if the ramp signal is generated by the ramp generator with a predetermined fall time, so that the closing signal for the second controllable semiconductor switch is at least only generated after the fall time. In particular, the voltage of the ramp signal drops linearly within the predeterminable fall time. When the voltage of the ramp signal drops, the supply voltage of the electrically operable motor also automatically drops in a ramp-like manner. In particular, an exact point in time at which the second controllable semiconductor switch is closed can be determined by the predetermined fall time of the ramp signal for the first controllable semiconductor switch. An improved and more reliable control of the semiconductor bridge can thus be realized.

It is likewise advantageous if the closing signal for the second controllable semiconductor switch is only generated after the fall time and after a predetermined fade-out time. A time buffer can thereby be created, so that it can be ensured that, when the second controllable semiconductor switch is closed, the first controllable semiconductor switch is open. A short circuit of the supply voltage can thus be reliably prevented.

It is also advantageous if an opening signal for the second controllable semiconductor switch is generated when there is a predetermined opening value of the pulse width modulation signal and a closing signal for the first controllable semiconductor switch is generated when the second controllable semiconductor switch is open. If for example the pulse width modulation signal jumps to a logical 1, this may for example represent the opening signal for the second controllable semiconductor switch. Only when the second controllable semiconductor switch is completely open is the first controllable semiconductor switch closed, so that a short circuit of the supply voltage can be reliably prevented.

According to a further advantageous embodiment, the ramp signal for the first controllable semiconductor switch can be generated with a predetermined rise time when the second controllable semiconductor switch is open. In other words, when the second controllable semiconductor switch is completely open, the ramp signal is applied to the first controllable semiconductor switch, so that the supply voltage likewise rises in a ramp-like manner. As a result, even when the first controllable semiconductor switch is closing, the switching process can be reliably carried out independently of the type of semiconductor switches used. In particular, this can improve the switching speed of the semiconductor bridge. Furthermore, the electromagnetic compatibility can also be increased when the first controllable semiconductor switch is closing. This allows reliable control of the semiconductor bridge for supplying the electrically operable motor to be realized.

It is also advantageous if the ramp signal is amplified by means of a voltage follower. The voltage follower is in particular an amplifier with a voltage gain of one, in the case of which in particular only the current is amplified. Improved operation of the semiconductor bridge can thereby be realized, since sufficient current can be made available for controlling the semiconductor switch even under load.

It has also proven to be advantageous if the fall time and/or the rise time, which are in particular linear, of the ramp signal and/or the fade-out time is predetermined by means of an input device. For example, the fall time and/or the rise time of the ramp signal and/or the fade-out time can be set manually by a person via the input device. This makes it possible to respond individually to special conditions. Furthermore, it is also possible that the fall time and/or the rise time and/or the fade-out time can be predetermined by the microcontroller. The method can thus be used in a large number of different electrically operable motors or semiconductor bridges.

It has also proven to be advantageous if a first switching voltage of the ramp signal for the first controllable semiconductor switch and a second switching voltage for the second controllable semiconductor switch are monitored. As a result, it can be reliably checked in which functional state or operating state the respective controllable semiconductor switches are. As a result, the switching speed of the semiconductor bridge can be increased, since the respective state of the semiconductor switch is continuously known by means of the monitoring, and a short circuit can thereby be reliably prevented despite the fast switching speed.

It is likewise advantageous if the control is performed by means of a microcontroller, so that at least the pulse width modulation signal is provided by the microcontroller. In particular, it can likewise be provided that, in addition to the pulse width modulation signal, the fall time and/or the rise time and/or the fade-out time are also controlled by means of the microcontroller. This allows reliable control of the semiconductor bridge to be realized.

Another aspect of the invention relates to a control device. The control device is designed to carry out a method as claimed in one of the preceding aspects or an advantageous embodiment thereof.

A still further aspect of the invention relates to an arrangement with a control device and with a semiconductor bridge with the two controllable semiconductor switches and with the electrically operable motor and with the microcontroller for generating the pulse width modulation signal.

According to an advantageous embodiment of the arrangement, the first controllable semiconductor switch may be connected as a high-side switch and the second controllable semiconductor switch as a low-side switch and the first controllable semiconductor switch may be controllable by means of the ramp signal.

The invention also includes developments of the control device according to an aspect of the invention and the arrangement according to an aspect of the invention, which have features as have already been described in connection with the developments of the method according to an aspect of the invention. For this reason, the corresponding developments of the control device according to an aspect of the invention and of the arrangement according to an aspect of the invention are not described again here.

The control device and the arrangement have in this respect physical features that allow the method to be carried out or an advantageous embodiment thereof.

BRIEF DESCRIPTION OF THE DRAWINGS

An exemplary embodiment of the invention is described below. In this respect.

DETAILED DESCRIPTION OF THE PREFERRED EMBODIMENTS

The exemplary embodiment explained below is a preferred embodiment of the invention. In the exemplary embodiment, the described components of the embodiment each represent individual features of the invention that are to be considered independently of one another, which also develop the invention independently of one another and are therefore also to be regarded as part of an aspect of the invention individually or in a combination other than the one shown. Furthermore, the described embodiment can also be supplemented by further features of aspects of the invention that have already been described.

In the figures, elements with the same function are each provided with the same reference symbols.

Figure 1:
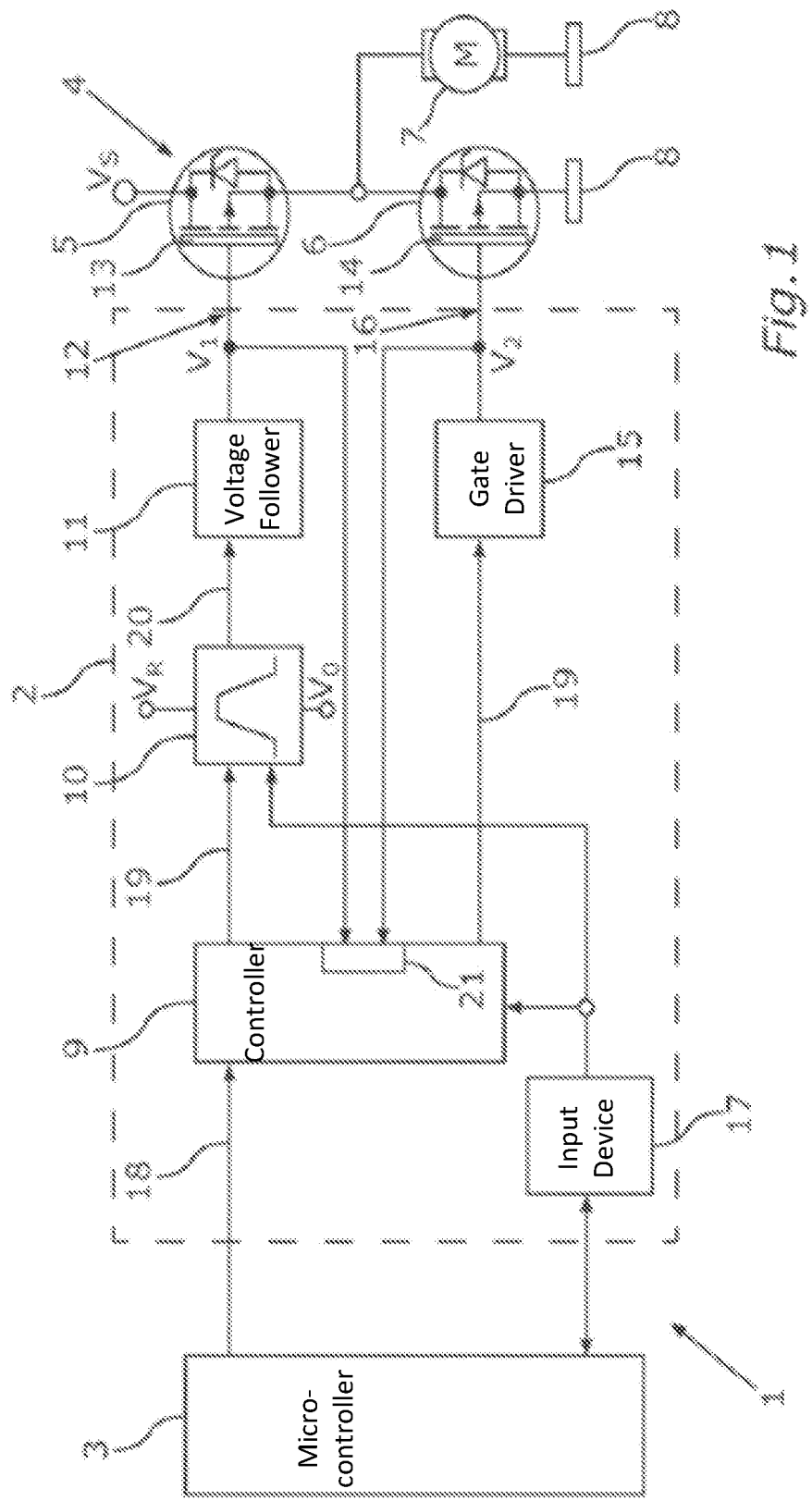
FIG. 1 shows a block diagram of an embodiment of an arrangement according to an aspect of the invention.

FIG. 1 schematically shows an embodiment of an arrangement 1. The arrangement 1 has a control device 2 and a microcontroller 3. Furthermore, the arrangement 1 has a semiconductor bridge 4, which in the present case is formed by a first controllable semiconductor switch 5 and a second controllable semiconductor switch 6. Furthermore, an electrically operable motor 7, which can be controlled via the semiconductor bridge 4, is connected to a node between the two controllable semiconductor switches 5, 6. In particular, a supply voltage $V_S$ can be controlled via the semiconductor bridge 4. The electrically operable motor 7 is in particular an electrically operable motor 7 of a motor vehicle. For example, the electrically operable motor 7 may be an adjustment motor, which is used for example in a window lifter or in a seat adjustment device. The electrically operable motor 7 is in particular a direct current motor, so that the electrically operable motor 7 is operated with electrical energy in the form of a direct voltage as the supply voltage $V_S$. Since, in particular in the case of adjusting motors, the power must be regulated, in the present exemplary embodiment the supply voltage $V_S$ must be controlled by means of the semiconductor bridge 4 in accordance with the required power for the electrically operable motor 7.

The first semiconductor switch 5 and the second semiconductor switch 6 are designed in particular as MOSFETs or IGBTs. The first controllable semiconductor switch 5 has a controllable first gate 13 and the second controllable semiconductor switch 6 has a controllable second gate 14. In particular, it is provided that the controllable semiconductor switches 5, 6 are closing switches, so that, when the gates 13, 14 are not supplied, the controllable semiconductor switches 5, 6 are open and are therefore non-conductive.

It is likewise possible that the controllable semiconductor switches 5, 6 are designed as make contacts, as a result of which the method explained below only changes on the basis of the corresponding parameter values of the controls.

The first semiconductor switch 5 is connected in particular as a high-side switch and the second controllable semiconductor switch 6 is connected in the present case in particular as a low-side switch. In other words, the first controllable semiconductor switch 5 is connected above the load, in particular the electrically operable motor 7, and is thus connected between the supply voltage $V_S$ and an electrical ground 8. The second controllable semiconductor switch 6 is in particular connected between the load, in other words the electrically operable motor 7, and the electrical ground 8.

In the present exemplary embodiment, the control device 2 has a controller 9, which is designed in particular to control the semiconductor bridge 4. Furthermore, the control device 2 has a ramp generator 10, by means of which a ramp signal 20 can be generated. The ramp generator 10 is supplied in particular via an additional ramp voltage between the supply points $V_R$ and $V_0$. The additional ramp voltage may be for example 13 volts.

Furthermore, it may be provided that the control device 2 has a voltage follower 11 for current amplification, by means of which the ramp signal 20 of the ramp generator 10 can be amplified.

The control device 2 has in particular a first electrical output 12, the first electrical output 12 being coupled to the gate 13 of the first controllable semiconductor switch 5 in the present exemplary embodiment.

The control device 2 also has a gate driver 15, by means of which the gate 14 of the second controllable semiconductor switch 6 can be activated. In particular, a control voltage by means of which the second switchable semiconductor switch 6 can be activated may be provided at another electrical output 16 by means of the gate driver 15.

Furthermore, it may be provided that the control device 2 has an input device 17, which can be controlled manually by a person or by the microcontroller 3. In particular, a fall time A1 and/or a rise time A2, which is in particular linear, of the ramp signal 20 and/or a fade-out time A3 can be predetermined via the input device 17.

A pulse width modulation signal 18 can in particular be transmitted to the controller 9 by means of the microcontroller 3. It is provided that the semiconductor bridge is controlled depending on the pulse width modulation signal 18, so that the electrically operable motor 7 can be supplied with the supply voltage $V_S$ by means of the pulse width modulation signal 18.

A control signal 19 can in turn be transmitted from the controller 9 to the ramp generator 10 depending on the pulse width modulation signal 18. In particular, the fall time A1 and/or the rise time A2 can be set in the ramp generator 10 by means of the input device 17. The ramp generator 10 in turn generates the ramp signal 20, which is sent to the voltage follower 11, so that only a current amplification of the ramp signal 20 is carried out. The gate driver 15 can also be controlled by means of the controller 9 via a further control signal 19. Furthermore, it may be provided that the controller 9 has a monitoring device 21, by means of which a first switching voltage $V_1$ of the ramp signal 20 for the first controllable semiconductor switch 5 and a second switching voltage $V_2$ for the second controllable semiconductor switch 6 can be monitored.

In the case of the method according to an aspect of the invention for controlling the semiconductor bridge 4 for the electrically operable motor 7, the semiconductor bridge 4 being provided with the first controllable semiconductor switch 5 and the separate second controllable semiconductor switch 6, the semiconductor bridge 4 is controlled depending on the pulse width modulation signal 18 for supplying the electrically operable motor 7 with electrical energy. It is provided that, depending on the pulse width modulation signal 18, the ramp signal 20 is generated with a predeterminable ramp slope 22 for controlling one of the two controllable semiconductor switches 5, 6 by means of the ramp generator 10. In the present example, it is provided in particular that the first controllable semiconductor switch 5 is controlled by means of the ramp signal 20.

Figure 2:
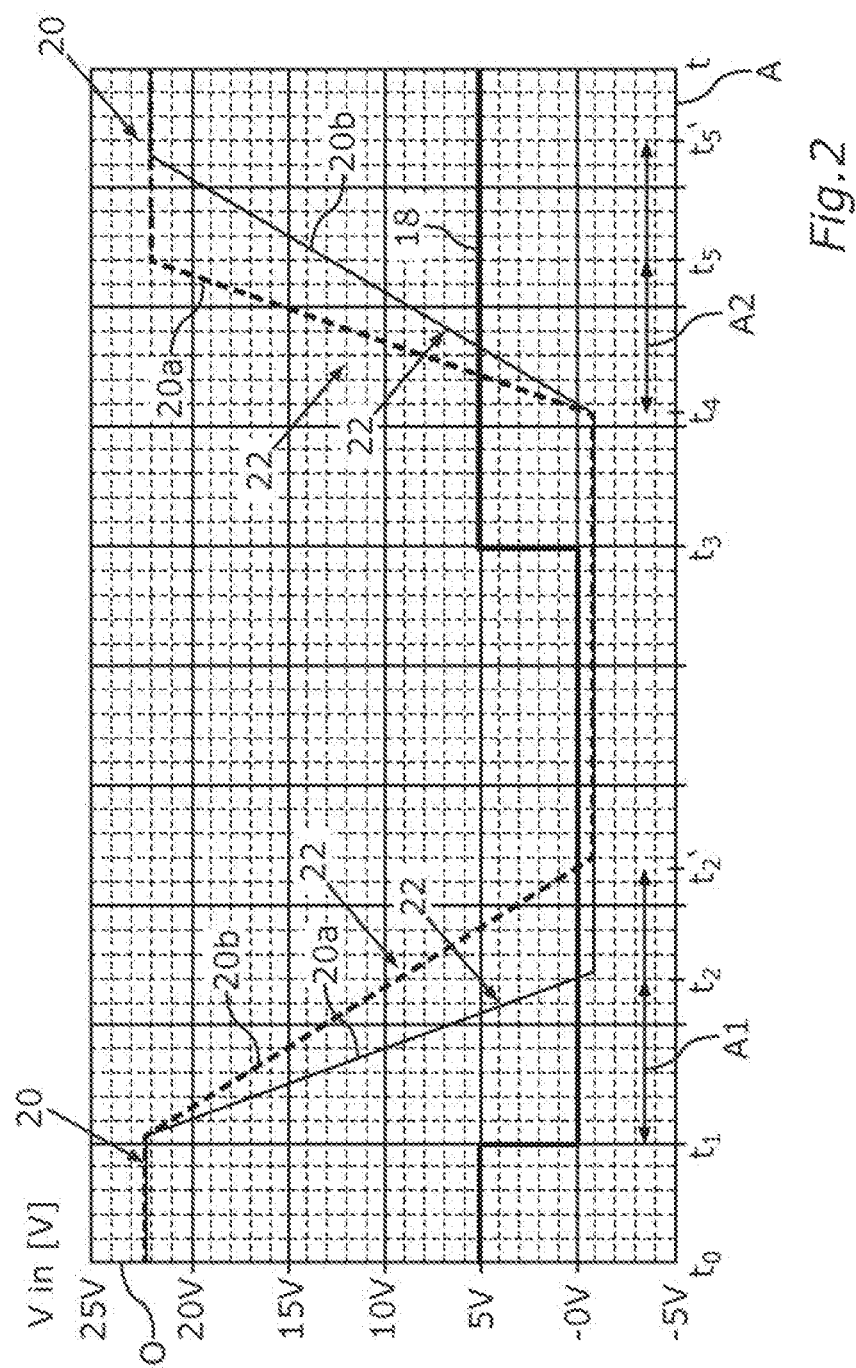
FIG. 2 shows a schematic voltage characteristic diagram.

FIG. 2 schematically shows a voltage characteristic diagram over time. In particular, in FIG. 2 the time t is plotted on the x axis A and the voltage V in volts is plotted on a y axis O. FIG. 2 shows in particular the characteristic of the ramp signal 20, which is dependent on the pulse width modulation signal 18. In the present FIG. 2, a first ramp signal 20a with a ramp slope 22 and a second ramp signal 20b with a ramp slope 22 different from the first ramp signal 20a are shown.

In the present case, the pulse width modulation signal 18 is designed for example in such a way that it is designed as a square wave signal between 0 volts and 5 volts. For example, 5 volts can be interpreted as logical 1 and 0 volts as logical 0. The voltage numbers in the present exemplary embodiment are to be seen as purely by way of example and in no way conclusive. They only serve to illustrate the idea of an aspect of the invention.

At time t0, the pulse width modulation signal 18 has 5 volts, which can be interpreted in particular as logical 1. In the present exemplary embodiment, the ramp signal 20 has 22 volts. At time t1, the pulse width modulation signal 18 drops to 0 volts. The ramp signal 20 is then likewise "run down". At time t2, the first ramp signal 20a reaches the 0 volt limit, which can be viewed in particular as an opening value, so that an opening signal is shown for the first switchable semiconductor switch 5, so that the first switchable semiconductor switch 5 opens. At time t2', the second ramp signal 20b shown reaches the corresponding 0 volt mark. In the present example, a negative voltage of 0.7 volts can be seen on the ramp signal 20a, 20b, which on account of the diode voltage is evident in the first switchable semiconductor switch 5. The time span between t1 and t2 or between t1 and t2' corresponds to the fall time A1.

At time t3, the pulse width modulation signal 18 jumps from the logical 0 to the logical 1 again. Since in particular the second controllable semiconductor switch 6 only has to be opened at time t3 (see FIG. 3), the ramp signal 20a, 20b is correspondingly only applied to the first controllable semiconductor switch 5 at time t4. The ramp signal 20a, 20b is accordingly brought back to the voltage of 22 volts with the ramp slope 22. At time t5, the first ramp signal 20a again reaches 22 volts and at time t5' the second ramp signal 20b again reaches 22 volts. The time between t4 and t5 or between t4 and t5' corresponds to the rise time A2 of the ramp signal 20.

Figure 3:
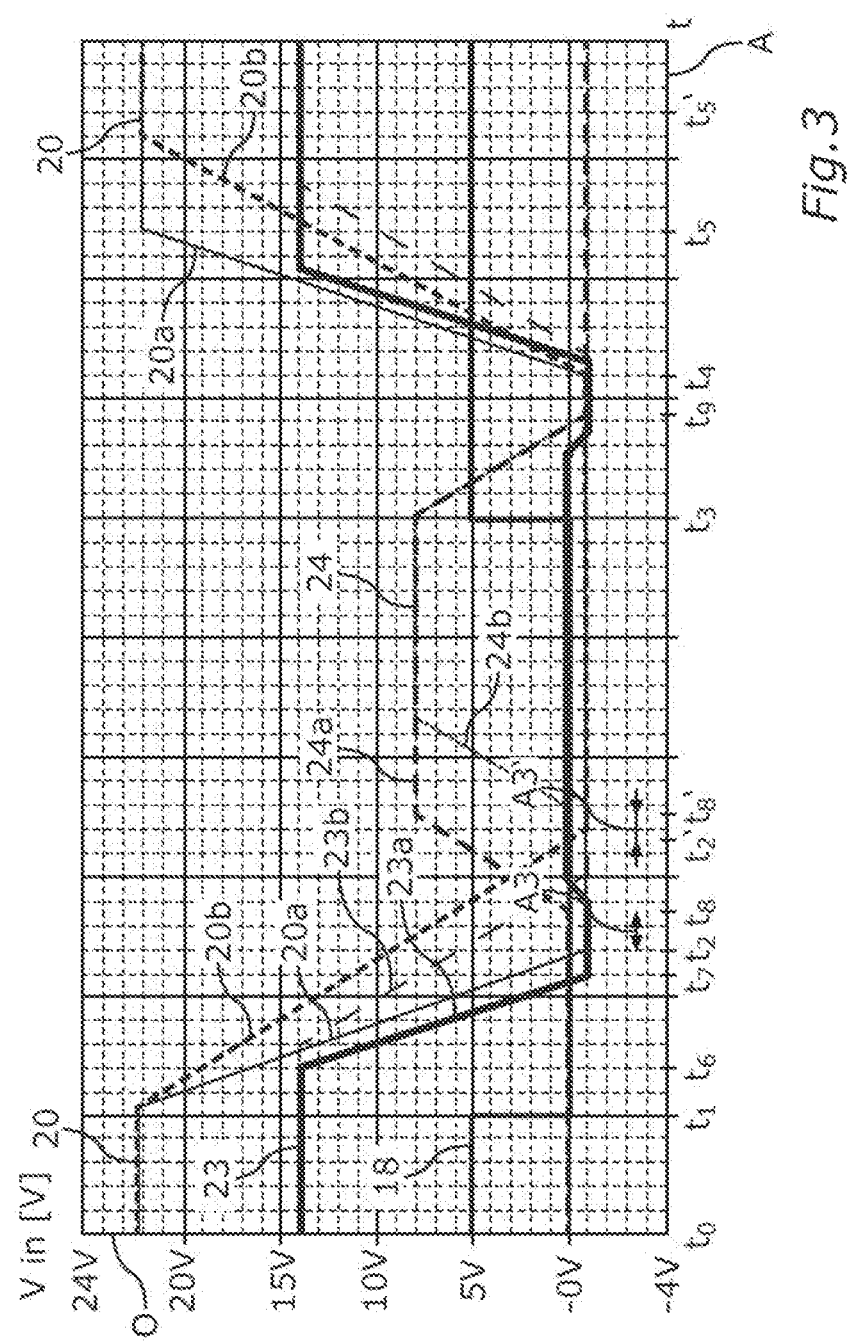
FIG. 3 shows a further schematic voltage characteristic diagram.

FIG. 3 shows a further schematic voltage characteristic diagram. The time t is plotted on the x axis A and the voltage in volts is plotted on the y axis O. The voltage characteristics with respect to the pulse width modulation signal 18 and with respect to the ramp signal 20 are identical to the representation from FIG. 2. The supply voltage $V_S$ is shown as the voltage characteristic 23. After the pulse width modulation signal 18 has dropped from the logical 1 to the logical 0 at the time t1, the supply voltage $V_S$ drops in a ramp-like manner at the time t6 on account of delay parameters at the first controllable semiconductor switch 5. FIG. 3 also shows two voltage characteristics 23a, 23b corresponding to the ramp signal 20a, 20b. In the present exemplary embodiment, the voltage characteristic 23a corresponding to the first ramp signal 20a and the voltage characteristic 23b corresponding to the second ramp signal 20b are shown. At time t7, the supply voltage $V_S$ reaches 0 volts, the voltage characteristic 23a or 23b falls further, to below 0 volts, on account of the diode voltages. At time t8, the second switchable semiconductor switch 6 is closed. In particular, the closing for the second controllable semiconductor switch 6 only takes place when the first controllable semiconductor switch 5 is closed, which is at the time t2. The time span between t2 and t8 is referred to as fade-out time A3, which can be predetermined as a safety measure, so that it can be reliably assumed that there is no short circuit. The same applies at times t2' and t8', which merely indicate the difference between the voltage characteristics 23a and 23b. The second switching voltage $V_2$ is represented in FIG. 3 by the voltage characteristic 24 or as the first voltage characteristic 24a of the second switching voltage $V_2$ and the second voltage characteristic 24b of the second switching voltage $V_2$.

At time t3, the pulse width modulation signal 18 is set from the logical 0 to the logical 1 again. The voltage characteristic 24 drops at time t3, so that at a predetermined opening value, in particular 0 volts, after the voltage value has dropped at the second switchable semiconductor switch 6 at time t9 and after a reaction time at time t4, the switching voltage $V_1$ is again ramped up at the gate 13 of the first switchable semiconductor switch 5 until it has reached full voltage again at time t5 or t5'.

Overall, the example shows how a method and a system for controlling a semiconductor bridge 4 with a constant ramp slope 22 and without a short circuit can be provided by an aspect of the invention.

LIST OF DESIGNATIONS

1 Arrangement
2 Control device
3 Microcontroller
4 Semiconductor bridge
5 First controllable semiconductor switch
6 Second controllable semiconductor switch
7 Electrically operable motor
8 Electrical ground
9 Controller
10 Ramp generator
11 Voltage follower
12 First electrical output
13 Gate
14 Gate
15 Gate driver
16 Second electrical output
17 Input device
18 Pulse width modulation signal
19 Control signal
20 Ramp signal
20a First ramp signal
20b Second ramp signal
21 Monitoring device
22 Ramp slope
23 Characteristic of the supply voltage
23a First characteristic of the supply voltage
23b Second characteristic of the supply voltage
24 Second switching voltage
24a First voltage characteristic of the second switching voltage
24b Second voltage characteristic of the second switching voltage
$V_1$ First switching voltage
$V_2$ Second switching voltage
$V_S$ Supply voltage
$V_R$ Supply point
$V_O$ Supply point
A1 Descent time
A2 Rise time
A3 Fade-out time

The invention claimed is:

1. A method for controlling a semiconductor bridge of an electrically operable motor, the semiconductor bridge being controlled including a first controllable semiconductor switch and a separate second controllable semiconductor switch for supplying the electrically operable motor with electrical energy, the method comprising:

outputting, by a controller, based on a pulse width modulation signal, a control signal to generate a ramp signal;

generating, by a ramp generator, in response to the control signal output by the controller, the ramp signal with a predeterminable ramp slope for controlling the first controllable semiconductor switch;

applying, by the controller, the control signal to the second controllable semiconductor switch; and applying, by the ramp generator, the ramp signal to the first controllable semiconductor switch, wherein the predeterminable ramp slope is determined by the controller to ensure that the first controllable semiconductor switch:

closes after the second controllable semiconductor switch opens, and opens before the second controllable semiconductor switch closes.

2. The method as claimed in claim 1,
wherein
the ramp signal for a predetermined opening value represents an opening signal for the first controllable semiconductor switch and a closing signal for the second controllable semiconductor switch when the first controllable semiconductor switch is open.

3. The method as claimed in claim 2,
wherein
the ramp signal is generated by the ramp generator with a predetermined fall time, so that the closing signal for the second controllable semiconductor switch is at least only generated after the fall time.

4. The method as claimed in claim 3,
wherein
the closing signal for the second controllable semiconductor switch is only generated after the fall time and after a predetermined fade-out time.

5. The method as claimed in claim 1, wherein
an opening signal for the second controllable semiconductor switch is generated when there is a predetermined opening value of the pulse width modulation signal and a closing signal for the first controllable semiconductor switch is generated when the second controllable semiconductor switch is open.

6. The method as claimed in claim 5,
wherein
the ramp signal for the first controllable semiconductor switch is generated with a predetermined rise time when the second controllable semiconductor switch is open.

7. The method as claimed in claim 1, wherein
the ramp signal is amplified by a voltage follower.

8. The method as claimed in claim 1, wherein
the fall time and/or the rise time of the ramp signal and/or the fade-out time is predetermined by an input device.

9. The method as claimed in claim 1, wherein
a first switching voltage of the ramp signal for the first controllable semiconductor switch and a second switching voltage for the second controllable semiconductor switch are monitored.

10. The method as claimed in claim 1, wherein
the pulse width modulation signal is output by a microcontroller to the controller.

11. A control device which is designed to carry out a method for controlling a semiconductor bridge of an electrically operable motor, the semiconductor bridge being controlled including a first controllable semiconductor switch and a separate second controllable semiconductor switch for supplying the electrically operable motor with electrical energy, the control device comprising:

a controller configured to output based on a pulse width modulation signal, a control signal to generate a ramp signal; and a ramp generator configured to generate in response to the control signal output by the controller, the ramp signal with a predeterminable ramp slope for controlling the first controllable semiconductor switch;

wherein the controller is further configured to apply the control signal to the second controllable semiconductor switch, wherein the ramp generator is further configured to apply the ramp signal to the first controllable semiconductor switch, wherein the predeterminable ramp slope is determined by the controller to ensure that the first controllable semiconductor switch:

closes after the second controllable semiconductor switch opens, and opens before the second controllable semiconductor switch closes.

12. The control device as claimed in claim 11, wherein the pulse width modulation signal is output by a microcontroller to the controller.

13. The control device as claimed in claim 12,
wherein the first controllable semiconductor switch is connected as a high-side switch and the second controllable semiconductor switch is connected as a low-side switch, and the first controllable semiconductor switch is controlled by the ramp signal.

* * * * *